(12) United States Patent
Feiweier et al.

(10) Patent No.: US 10,422,844 B2
(45) Date of Patent: Sep. 24, 2019

(54) METHODS FOR SETTING A MRI SEQUENCE

(71) Applicants: Thorsten Feiweier, Poxdorf (DE); Andreas Greiser, Erlangen (DE); Uvo Hölscher, Erlangen (DE); Thorsten Speckner, Erlangen (DE); David Grodzki, Erlangen (DE); Mathias Nittka, Baiersdorf (DE); Daniel Nico Splitthoff, Erlangen (DE)

(72) Inventors: Thorsten Feiweier, Poxdorf (DE); Andreas Greiser, Erlangen (DE); Uvo Hölscher, Erlangen (DE); Thorsten Speckner, Erlangen (DE); David Grodzki, Erlangen (DE); Mathias Nittka, Baiersdorf (DE); Daniel Nico Splitthoff, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 15/407,141

(22) Filed: Jan. 16, 2017

(65) Prior Publication Data

US 2017/0205483 A1    Jul. 20, 2017

(30) Foreign Application Priority Data

Jan. 18, 2016    (DE) .................... 10 2016 200 549

(51) Int. Cl.
*G01V 3/00* (2006.01)
*G01R 33/54* (2006.01)
(Continued)

(52) U.S. Cl.
CPC ......... *G01R 33/543* (2013.01); *G01R 33/288* (2013.01); *G01R 33/385* (2013.01)

(58) Field of Classification Search
CPC .......................... G01R 33/543; G01R 33/561; G01R 33/4824; G01R 33/4822; G01R 33/3854;
(Continued)

(56) References Cited

U.S. PATENT DOCUMENTS 6,687,527 B1    2/2004    Wu et al.
2005/0077895 A1    4/2005    Hargreaves et al.
(Continued)

FOREIGN PATENT DOCUMENTS

CN    103323802 A    9/2013
CN    104101849 A    10/2014
(Continued)

OTHER PUBLICATIONS

German Office Action for German Application No. 102016200549.9 dated May 5, 2017, with English Translation.
(Continued)

*Primary Examiner* — Rodney E Fuller
(74) *Attorney, Agent, or Firm* — Lempia Summerfield Katz LLC

(57) ABSTRACT

A method for setting a MRI sequence, a magnetic resonance device, and a computer program product are provided. The method includes providing, by a limitation unit, at least one limitation; providing, by a parameter provision unit, a plurality of parameters of the sequence, wherein at least one parameter of the plurality of parameters is assigned to a default parameter value; selecting, by a selection unit, a parameter of the plurality of parameters; determining, by a simulation unit, at least one sequential pattern based on at least one default parameter value of the default parameter values; determining, by an analysis unit, a permissible range of parameter values of the selected parameter based on at least one sequential pattern and the at least one limitation; and establishing, by an establishment unit, a new parameter
(Continued)

value of the selected parameter within the permissible range of the parameter values.

27 Claims, 7 Drawing Sheets

(51) Int. Cl.
    *G01R 33/28*      (2006.01)
    *G01R 33/385*      (2006.01)

(58) Field of Classification Search
    CPC .................................. G01R 33/3852;
                    G01R 33/5608; G01R 33/36; G01R
                    33/38; G01R 33/482; G01R 33/4826;
                    G01R 33/4828; G01R 33/483
    USPC ......................................... 327/309
    See application file for complete search history.

(56) References Cited

U.S. PATENT DOCUMENTS

| | | |
|---|---|---|
| 2009/0069664 A1 | 3/2009 | Kim |
| 2013/0057281 A1 | 3/2013 | Feiweier |
| 2013/0090776 A1 | 4/2013 | Feiweier |
| 2013/0253876 A1 | 9/2013 | Pfeuffer |
| 2014/0292333 A1 | 10/2014 | Beck |
| 2014/0320127 A1 | 10/2014 | Paul |
| 2015/0097562 A1 | 4/2015 | Grodzki |
| 2015/0204959 A1 | 7/2015 | Grodzki |
| 2015/0212179 A1 | 7/2015 | Overall et al. |
| 2015/0285885 A1 | 10/2015 | Feiweier et al. |
| 2015/0293190 A1 | 10/2015 | Paul et al. |
| 2015/0293191 A1 | 10/2015 | Paul et al. |
| 2015/0366517 A1 | 12/2015 | Hoelscher |
| 2017/0123031 A1 | 5/2017 | Grodzki et al. |
| 2017/0205483 A1 | 7/2017 | Feiweier |
| 2017/0234944 A1 | 8/2017 | Grodzki |

FOREIGN PATENT DOCUMENTS

| | | |
|---|---|---|
| CN | 104122519 A | 10/2014 |
| CN | 104808162 A | 7/2015 |
| CN | 105203977 A | 12/2015 |
| DE | 102008015261 B4 | 11/2009 |
| DE | 102014206636 A1 | 10/2015 |
| DE | 102014207099 B4 | 12/2015 |
| DE | 102014207100 B4 | 12/2015 |
| DE | 102015221051 A1 | 5/2017 |
| DE | 102016200549 A1 | 7/2017 |
| DE | 102016202240 A1 | 8/2017 |
| JP | 2005501624 A | 1/2005 |
| KR | 20130025345 A | 3/2013 |

OTHER PUBLICATIONS

Korean Office Action for Korean Application No. 10-2017-0008142, dated Jul. 6, 2018, with English Translation.
Korean Notice of Allowance for Korean Application No. 10-2017-0008142, dated Nov. 27, 2018.
Chinese Office Action for Chinese Application No. 201710037384.8 dated Mar. 1, 2019, with English Translation.

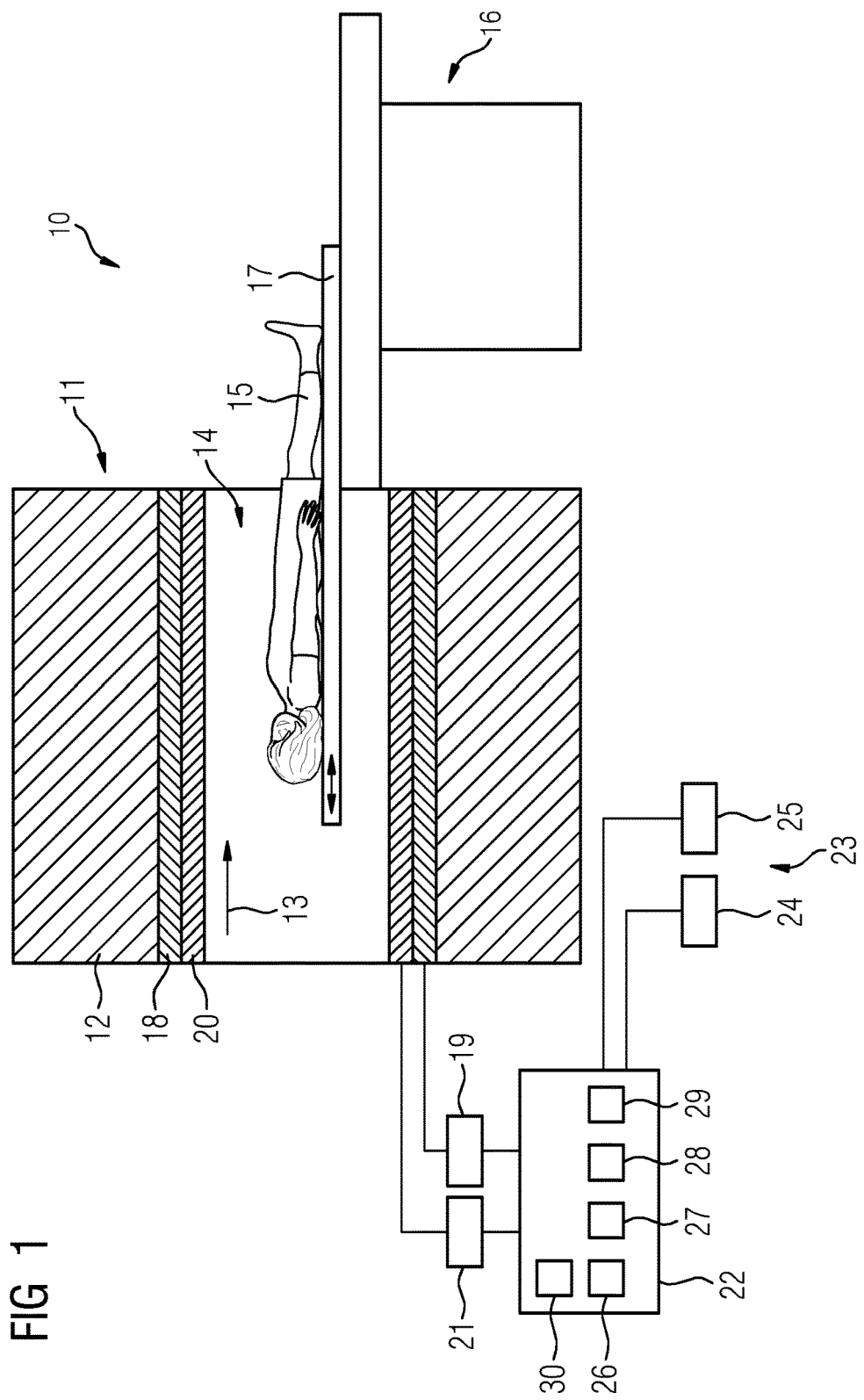

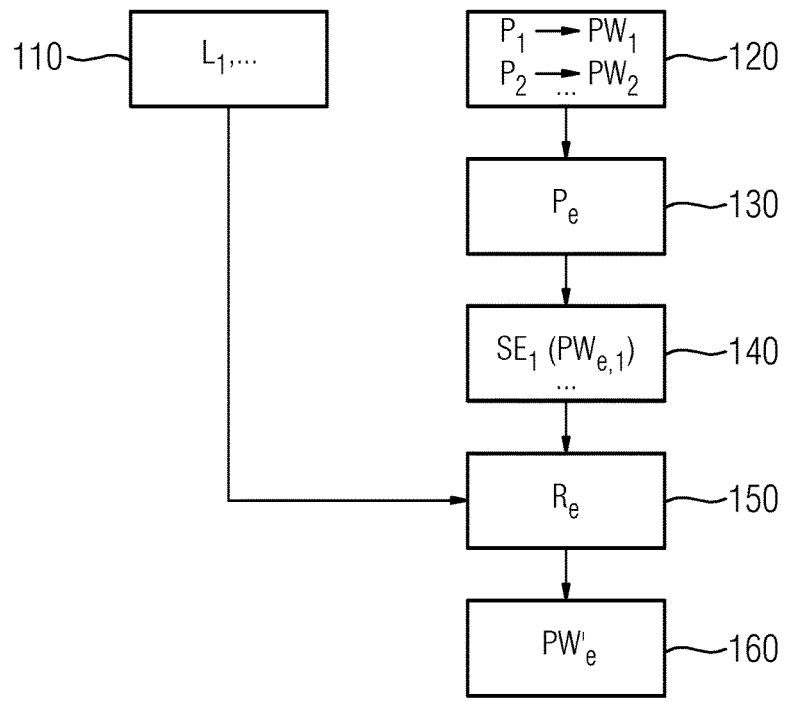
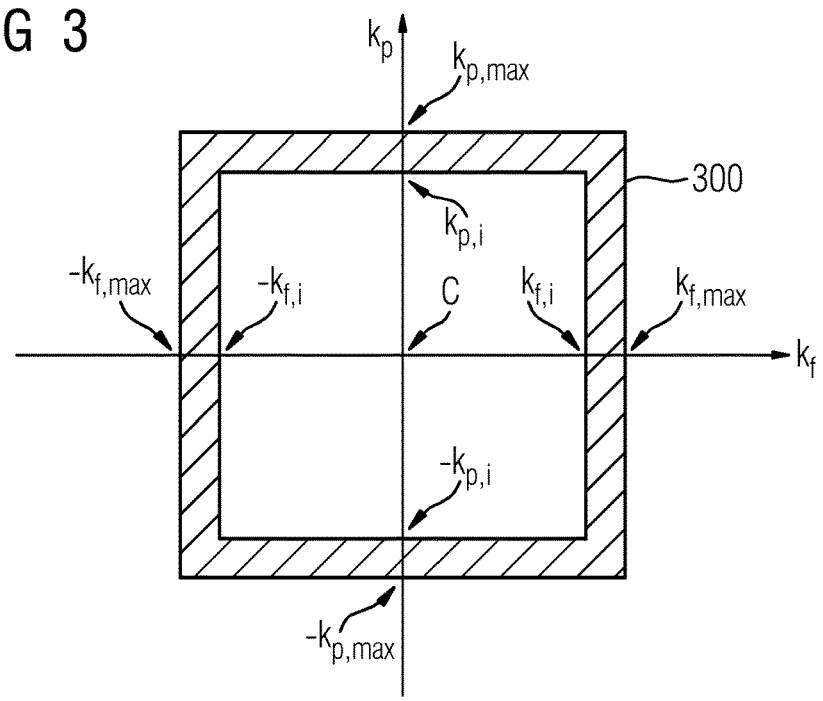

FIG 4
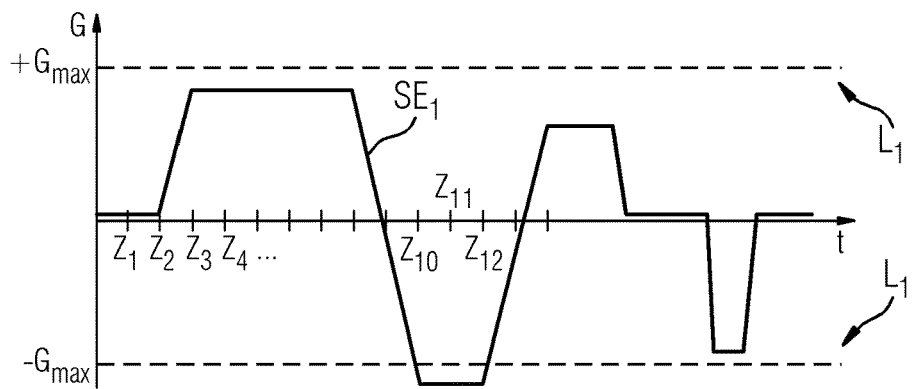
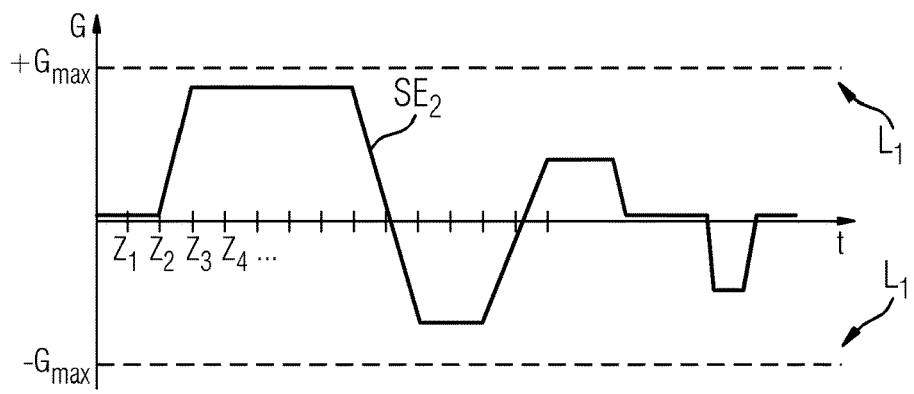
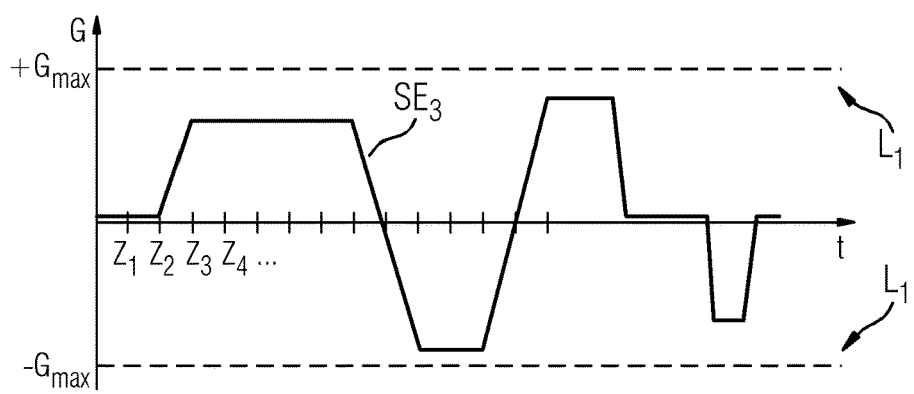

FIG 5

$PW_{e,1} \longrightarrow SE_{e,1}$ ✓

$PW_{e,2} \longrightarrow SE_{e,2}$ ✗

$PW_{e,3} \longrightarrow SE_{e,3}$ ✗

$PW_{e,4} \longrightarrow SE_{e,4}$ ✓

$PW_{e,5} \longrightarrow SE_{e,5}$ ✓

$PW_{e,6} \longrightarrow SE_{e,6}$ ✗

$PW_{e,7} \longrightarrow SE_{e,7}$ ✗

$PW_{e,8} \longrightarrow SE_{e,8}$ ✗

$PW_{e,9} \longrightarrow SE_{e,9}$ ✓

$PW_{e,10} \longrightarrow SE_{e,10}$ ✓

$PW_{e,2}$ $PW_{e,3} \longrightarrow SE_{e,3}$ ✓

$PW_{e,4} \longrightarrow SE_{e,4}$ ✗

$PW_{e,5}$ $PW_{e,6} \longrightarrow SE_{e,6}$ ✗

$PW_{e,7}$ $PW_{e,8}$ $PW_{e,9}$ $PW_{e,10}$

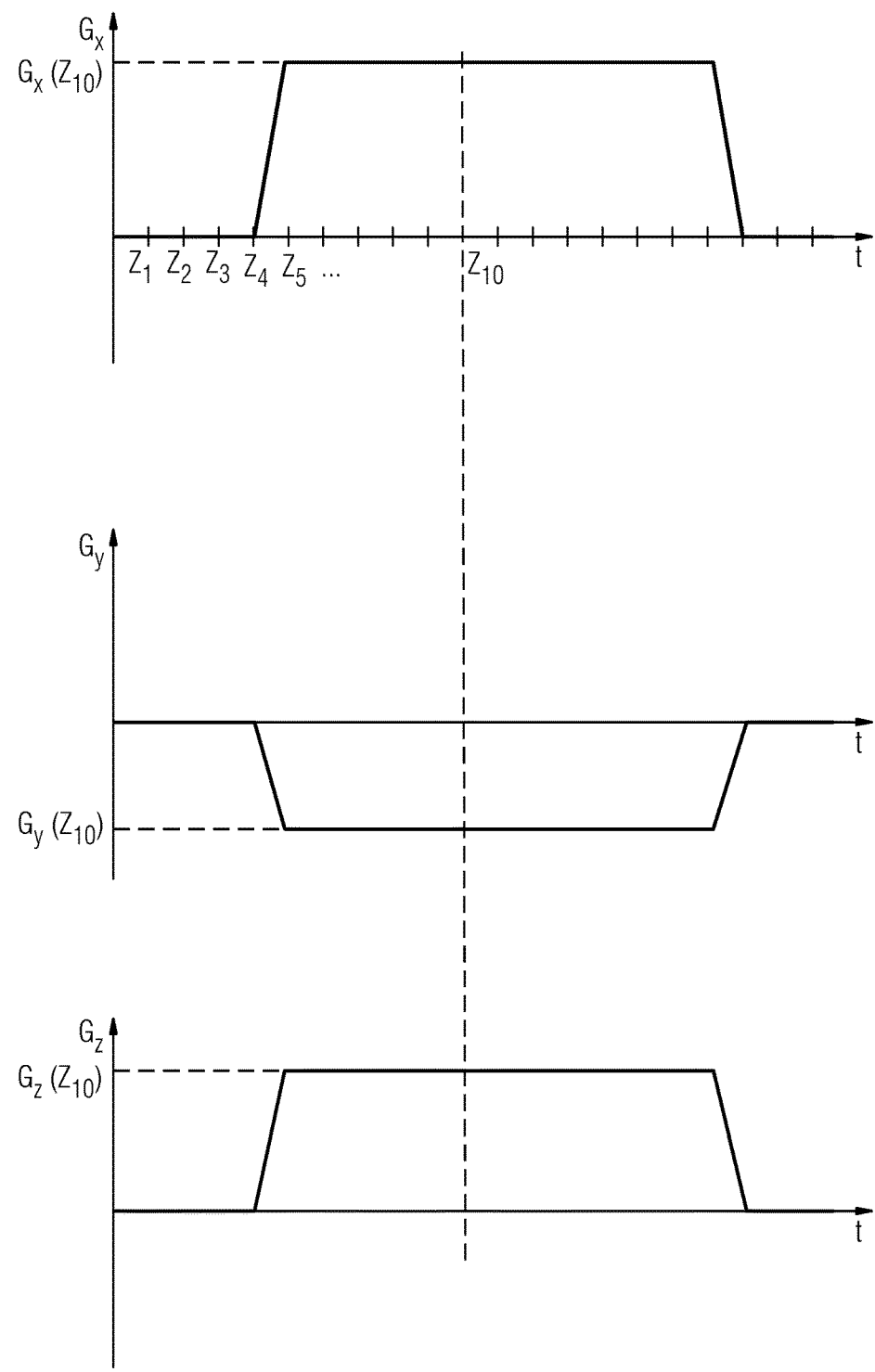

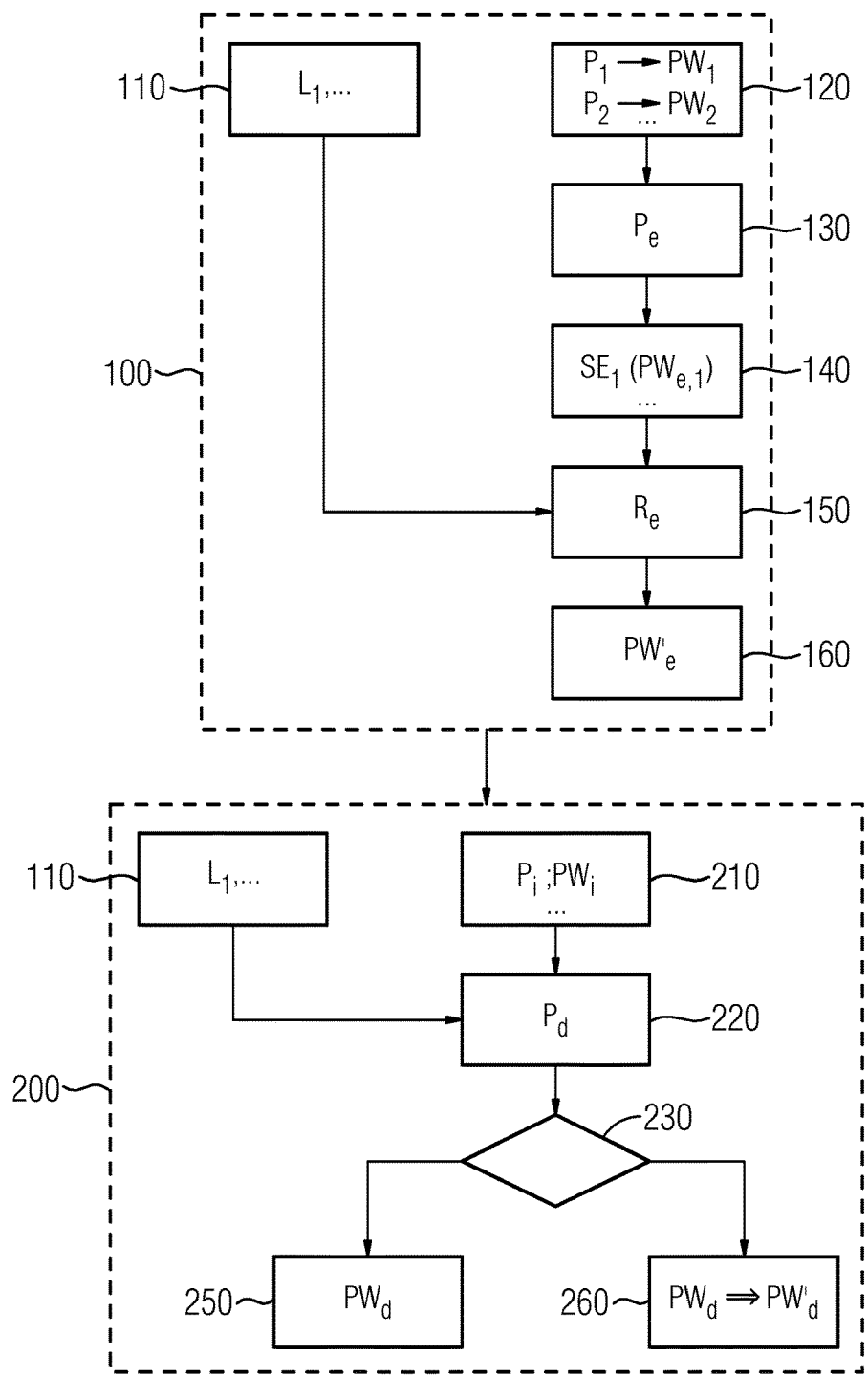

METHODS FOR SETTING A MRI SEQUENCE

The application claims the benefit of German Patent Application No. DE 10 2016 200 549.9, filed Jan. 18, 2016, which is hereby incorporated by reference in its entirety.

TECHNICAL FIELD

The disclosure relates to a method for setting a MRI sequence. The disclosure also relates to a magnetic resonance device and a computer program product configured to execute a method for setting the MRI sequence.

BACKGROUND

In order to perform magnetic resonance imaging (MRI) of an object under investigation with a magnetic resonance device, radio-frequency excitation pulses are generated with the aid of a RF antenna unit, with the aid of which nuclear spins are brought out of their states of equilibrium. Subsequently, a measurable magnetic resonance signal arises which is read out by the RF antenna unit. To confer location information on this magnetic resonance signal, magnetic field gradients are generated with the aid of a gradient coil unit. The timing of the excitation and readout of the magnetic resonance signals and the generation of the magnetic field gradients is established by a sequence.

Depending on which examination aim is to be pursued, different sequence types such as a gradient echo sequence and/or a spin echo sequence, may be applied. A sequence may include a plurality of repetitions with which different areas of a measurement area, which is often also called a k-area and/or spatial frequency area, may be acquired. A sequence is customarily described by parameters such as repetition time (TR), echo time (TE), flip angle, readout bandwidths, etc. With the aid of a user interface, an operator may customarily enter parameter values for these parameters.

By a wide variety of dependencies and/or interactions between these parameters which, inter alia, depend on the sequence type selected and the embodiment of the magnetic resonance device, the areas of the parameter values available influence each other mutually so that only certain parameter constellations are possible.

SUMMARY AND DESCRIPTION

The scope of the present disclosure is defined solely by the appended claims and is not affected to any degree by the statements within this summary. The present embodiments may obviate one or more of the drawbacks or limitations in the related art.

The object of the present disclosure is to conveniently allow the operator the largest possible number of parameter constellations for the adjustment of a sequence.

Accordingly, a method for setting a magnetic resonance imaging sequence includes providing at least one limitation by a limitation provision unit. A plurality of parameters of the sequence are provided by a parameter provision unit, wherein a default parameter value is assigned to at least one, or each, of the plurality of parameters. One of the plurality of parameters is selected by a selection unit. A simulation unit establishes at least one sequential pattern based on at least one of the default parameter values. Based on the at least one sequential pattern and based on the at least one limitation, an analysis unit determines a permissible range of parameter values of the selected parameter. Within the permissible range of parameter values, a new parameter value is determined by a determination unit.

As units largely operating independently of a sequence may be involved in the case of the simulation unit and/or the analysis unit, compared to methods which are configured to specific sequences, the method is applicable to any sequences.

The method may be performed several times, for example, to determine a plurality of new parameter values, in particular various parameters. Thus, a sequence may be adjusted and/or optimized repetitively.

The permissible range of parameter values may be connected or interrupted, e.g., include a plurality of unconnected intervals. The new parameter value may be determined within the permissible range of parameter values automatically and/or by the operator. If the determination is performed by an operator, the operator may conveniently set a possible parameter value for the selected parameter. To this end, the permissible range of parameter values may be displayed for the operator using an output unit, for example, a monitor. This display may be in color and/or graphically encoded to make it easier for the operator to determine the new parameter value. Advantageously, measurement data may be acquired by the magnetic resonance device based on the new parameter value.

A limitation may refer to a condition the fulfillment of which is advantageous, in particular, necessary and/or indispensable, for operation. The at least one limitation may include at least one device limitation and/or at least one application limitation.

A device limitation may be understood to refer to a restriction resulting from an embodiment of the magnetic resonance device with which the magnetic resonance imaging is to be performed. A maximum gradient amplitude and/or a maximum slew rate, which may be generated by a gradient coil unit of the magnetic resonance device, are exemplary. A slew rate may refer to the amount of the time derivative of the gradient amplitude, e.g., above all, a rate of change of the gradient amplitude independent of sign may be understood.

An application limitation may refer to a restriction resulting from an influence of the magnetic resonance device and/or an object under investigation, (e.g., a human or animal patient), on account of the performance of a sequence. Thus, for example, it is possible that an application of excessively high gradient amplitudes may cause excessive heating of the magnetic resonance device or a part of the magnetic resonance device. Apart from technical limits, there may also be physiological limits. For example, incorrect operation of the magnetic resonance device may result in excessive stimulation of the peripheral nerves of the patient.

The at least one limitation may include at least one, (e.g., adjustable), safety buffer. For example, a physical and/or physiological limit value that is still just possible is not provided as a limitation but a value which conservatively differs from a maximum possible limit value. In this way, the operating safety of the magnetic resonance device may be increased.

The at least one limitation may be stored in a database accessed by the limitation provision unit. Advantageously, the limitation provision unit transmits the at least one limitation to the analysis unit.

Advantageously, the plurality of parameters is suitable for describing and/or determining the sequence. Exemplary parameters are a repetition time (TR) and/or an echo time (TE) and/or a flip angle and/or a readout bandwidth and/or a layer orientation and/or a field of view (FoV).

The plurality of parameters and/or the default parameter values assigned to the parameters may be stored in a database accessed by the parameter provision unit. Advantageously, the parameter provision unit transmits the plurality of parameters and/or the parameter values to the output unit to at least partially display these parameters and/or parameters derived therefrom and/or parameter values to the operator.

Selection may be performed by the operator and/or automatically. If the operator performs the selection, the selection unit advantageously includes an input unit that, for example, has a monitor. The operator performs the selection, for example, by selecting an input field on the monitor which is assigned to the desired parameter. This input field may, for example, already have a default parameter value which may be changed subsequently, for example, by inputting a new parameter value manually. An automatic selection may be structured such that the sequence is optimized, for example, with regard to duration, without the need for an operator to intervene manually.

A sequential pattern customarily depicts a temporal sequence of sequence events such as excitation pulses and/or gradient pulses and/or readout procedures. The determination of the at least one sequential pattern may refer to the temporal unrolling of the sequence. The determination of the at least one sequential pattern, in particular, takes place based on one or more parameter values not assigned to the selected parameter.

The determination of a sequential pattern may include the calculation of a table of values, wherein the table of values includes a first column and a second column, wherein the first column includes at least one time value and the second column at least one historical value assigned to the at least one time value. In the process, a time value customarily corresponds to a time of the sequential pattern, so that the number of lines of the table of values results from the number of times of the sequential pattern. The historical values are customarily dependent on at least one of the parameter values.

Possible historical values may be gradient amplitudes, which may be applied to a physical gradient axis of the gradient coil unit, namely the physical gradient axes. A sequential pattern including gradient amplitudes may take into account correction gradients and/or compensation gradients, (e.g., eddy current compensation gradients), so that the sequential pattern depicts the actual implementation of the gradient coil unit. A method therefore operates in accordance with this aspect possibly more precisely than with any consideration in abstracted form.

The gradient coil unit may include three physical gradient axes referred to as the x, y, and z axes. In the case of a magnetic resonance device with a cylindrical patient receiving area, the z axis often corresponds to the cylinder axis of the patient receiving area. A vertical axis at right angles to the z axis may be defined as the y axis and as the x axis a horizontal axis at right angles to the y axis and z axis.

Only a limited gradient amplitude, namely a maximum gradient amplitude, may customarily be applied to each of the three physical gradient axes which may customarily be changed with a limited slew rate, namely the maximum slew rate.

Logical gradient axes may be distinguished from the physical gradient axes. The logical gradient axes customarily include a layer selection gradient axis, a phase coding gradient axis, and a frequency coding gradient axis which as a rule form a three-dimensional right-angled coordinate system. The relative position of the logical gradient axes to the physical gradient axes customarily establishes the orientation of the measurement area, in particular, of a layer for measurement.

A layer selection gradient is customarily applied parallel to the layer selection gradient axis. With the aid of layer selection gradient pulses, (e.g., also abbreviated to layer selection gradients), atomic nuclei may be specifically excited in a desired layer. Furthermore, phase coding gradient pulses, (e.g., also abbreviated to phase coding gradients), are customarily applied parallel to the phase coding gradient axis and frequency coding gradient pulses, (e.g., also abbreviated to frequency coding gradients), parallel to the frequency coding gradient axis. Phase coding gradients and frequency coding gradients may enable spatial coding of the magnetic resonance signals in the excited layer. A frequency coding gradient may also be referred to as a readout gradient as it is customarily applied simultaneously during the readout of the magnetic resonance signal.

Depending on orientation and/or tilting of the measurement area and/or the measurement layer, the logical gradient axes also customarily deviate from the physical gradient axes so that, depending on the orientation and/or tilting of the measurement area and/or the measurement layer, the gradient pulses of the logical gradient axes are spread over the physical gradient axes.

The at least one sequential pattern may include a plurality of times. In order to establish whether a certain parameter value of the selected parameter is permissible, in other words, within the permissible range of parameter values, each of the times may be examined in terms of the at least one limitation. On the other hand, it is customarily sufficient to find only one time at which the at least one limitation is not met in order to establish that the parameter value of the sequential pattern is not permissible so that the examination of the sequential pattern may be interrupted.

With regard to the example shown, accordingly the table of values is determined for each time value, which parameter values are possible without the gradient amplitude pertaining to this time value exceeding a maximum gradient amplitude. By analogy, the slew rate may also be examined.

To determine the permissible range of parameter values of the selected parameter, various test parameter values may be determined for the parameter value of the selected parameter, e.g., the parameter value of the selected parameter may be varied. For each of the test parameter values, at least one sequential pattern may be determined, which is examined by an analysis unit with regard to the at least one limitation. By varying one parameter value, in particular, the parameter value of the selected parameter, various test sequential patterns may thus be determined. For example, a first test sequential pattern is determined for a first parameter value, a second test sequential pattern for a second parameter value, etc.

Insofar as the at least one limitation includes a plurality of limitations (or more than one limitation), it is suggested that the plurality of limitations is examined in a prescribed order. For example, a maximum gradient amplitude may be examined as a first limitation, a maximum slew rate as a second limitation, a maximum stimulation as a third limitation, and a maximum temperature increase as a fourth limitation. In particular, an examination may be interrupted as soon as a limitation is not fulfilled. By prioritizing the plurality of limitations, a permissible range of parameter values may be efficiently determined.

One embodiment provides that the at least one sequential pattern describes a section of the sequence. It is therefore conceivable that the at least one sequential pattern is not necessarily generated for a complete sequence but only for a certain part of the sequence. Advantageously, the section is representative of the entire sequence so that from an examination of this section the permissible range of parameter values of the selected parameter may be concluded for the entire sequence, for example, by extrapolation.

The sequential pattern may describe a section of the sequence by which external k-space points are encoded. Such external k-space points may be located at least 70%, at least 80%, or at least 90% from the center of the k-space in relation to the entire k-space.

One embodiment provides that the permissible range of parameter values is determined with the aid of a complete or gapless search and/or of a binary search, in particular, of interval nesting.

For the gapless search and/or binary search, a range of parameter values to be examined may be discretized, e.g., divided into a finite number of possible parameter values. This division may take place in constant increments, e.g., each possible parameter value is at an equal distance from the nearest possible parameter value. However, it is also conceivable that the distances vary.

A gapless search is suitable for non-convex parameter ranges, e.g., invalid values exist between a valid minimum and a valid maximum of the non-convex parameter area. A valid value may refer to a parameter value through the application of which the at least one condition is satisfied. Accordingly, an inapplicable value may refer to a parameter value for which this is not the case. This concerns, for example, rotation angles which describe the relative position of logical gradient axes to physical gradient axes.

In the gapless search, one by one a sequential pattern may be determined respectively for various, for example, consecutive, parameter values and examined as to whether the respective parameter value is permissible. In a gapless search with N possible parameter values, customarily all the N parameter values are also examined as test parameter values.

A binary search efficiently limits the permissible range of parameter values gradually.

A first start parameter value and a second start parameter value are customarily present in a binary search. The at least one limitation may be satisfied when using the first start parameter value. In an act of the binary search, as a first test parameter value a parameter value is examined in terms of the at least one limitation which is found midway between the first and the second start parameter value, e.g., it is examined whether one or more limitations are satisfied when this test parameter value is used. A central parameter value advantageously divides a quantity of test parameter values for examination into two partial quantities the numbers of test parameter values of which differ by at most one.

If the examination of the first test parameter value shows that the at least one limitation is satisfied, in another act, a parameter value is examined as a second test parameter value which is found midway between the second start parameter value and the first test parameter value. Otherwise, a parameter value is examined as a second test parameter value which is found midway between the first start parameter value and the first test parameter value. According to this principle, the permissible parameter range is restricted ever more until an external parameter value is found during the application of which the at least one condition is still just satisfied, e.g., a parameter value is adjacent to the external parameter value which infringes the at least one limitation. This method is particularly efficient as the length of the search area is halved from act to act so that customarily with N possible parameter values, only $\log_2(N+1)$ test parameter values need be examined.

If the binary search shows that during the application of the second start parameter value at least limitations are also satisfied, a new binary search takes place advantageously in which the examined range of parameter values extends beyond the second start parameter value, e.g., the second start parameter value functions as a new first start parameter in the ongoing binary search value and a new second start parameter value is selected for which there is a greater difference to the first start parameter value than to the second start parameter value of the original binary search.

Binary searches are particularly advantageous for convex parameter ranges. A convex parameter range customarily has a minimum and a maximum between which all the values are valid. As a rule, this assumption is valid for many parameters such as the echo time, the repetition time, and/or the field of view.

The first start parameter value and the second start parameter value for the binary search may be derived from the at least one limitation. It is therefore conceivable that appropriate start parameter values may be determined by simple assessment methods based on the at least one limitation.

One embodiment provides that the at least one limitation includes at least one absolute limitation, (e.g., at least one absolute maximum gradient amplitude and/or slew rate), and at least one limitation, (e.g., at least one conservative maximum gradient amplitude and/or slew rate). The at least one absolute limitation may establish an absolute range of parameter values and the at least one conservative limitation a conservative range of parameter values. In at least one differential area of an absolute range of parameter values and a conservative range of parameter values, a permissible range of partial parameter values may be determined. The permissible range of parameter values thereby includes the conservative range of parameter values and the at least one permissible range of partial parameter values.

An absolute limitation may refer to a limit which is observed and/or may not be exceeded under any circumstances. For example, a gradient coil of a magnetic resonance device may only produce a certain absolute maximum gradient amplitude and/or slew rate on account of its electronic and mechanical embodiment. An absolute limitation is customarily independent of any other limitations.

A conservative limitation advantageously excludes parameter constellations as a result of which one or more absolute limitations might possibly be exceeded, wherein a parameter constellation may refer to a set of parameter values.

As aforementioned, the most varied dependencies and/or interactions may exist between these parameters, enabling, for example a first parameter value $PW_1$ of a first parameter $P_1$ to be represented as a function $f$ of a second parameter value $PW_2$ of a second parameter $P_2$ and if applicable, further parameter values: $PW_1 = f(PW_2, \ldots)$. A conservative limitation may be a limitation which restricts a second range of parameter values $R_2$ for the second parameter $P_2$ such that for the second parameter $P_2$ any parameter value $PW_2$ may be selected from the range of parameter values $R_2$, enabling a parameter value $PW_1$ which satisfies at least one limitation to be produced for the first parameter $PW_1$.

This may apply to any additional parameter values $PW_3$. In particular, a conservative limitation may be a limitation that restricts a second range of parameter values $R_2$ for the second parameter $P_2$ such that for a third parameter $P_3$ any parameter value $PW_3$ may be selected from the range of parameter values $R_3$, enabling a parameter value $PW_1$ which satisfies at least one limitation to be produced for the first parameter $PW_1$.

The at least one conservative limitation therefore only permits parameter constellations $PW_2, PW_3, \ldots$, for which the first parameter $P_1$ assumes a parameter value $PW_1$ which is within the permissible parameter range and in particular within a conservative range of parameter values $R_{1,con}$, e.g., the conservative range of parameter values $R_{1,con}$ includes parameter values $PW_1$ which are the result of the at least one conservative limitation.

For example, by way of a conservative gradient limitation, such as a restriction of the gradient amplitudes and/or slew rates on the logical gradient axes, (e.g., restricted to $1/\sqrt{3}$ of the maximum gradient amplitudes and/or slew rates of the physical gradient axes), it is possible for an absolute gradient limitation such as the maximum gradient amplitudes and/or slew rates on the physical gradient axes, to be observed in each relative position of the logical gradient axes to the physical gradient axes.

Extrapolated to a more abstract notation, by way of example the gradient amplitude of a physical gradient axis may be regarded as the first parameter value $PW_1$, which may at most assume one maximum gradient amplitude $G_{max,phys}$, e.g., $PW_1 \varepsilon [0; G_{max,phys}]$. By restricting the gradient amplitude $G_{max,log}$ of a logical gradient axis to $G_{max,log} = G_{max,phys}/\sqrt{3}$, (e.g., $PW_2 \varepsilon [0; G_{max,log}]$), a rotation angle $P_3$ describing a relative position of the logical gradient axes to the physical gradient axes may assume any rotation value $PW_3$, (e.g., $PW_3 \varepsilon [0; 360°]$).

In particular, in observing the at least one conservative limitation such as a conservative gradient limitation, at least one parameter value of the plurality of parameters may be freely determined, in particular, a parameter which establishes the orientation of the measurement range such as a rotation parameter.

Advantageously, the conservative range of parameter values derived from the one or more conservative limitations does not have to be examined using, for example, a binary search, enabling the method to be accelerated. Therefore, only the absolute parameter range exceeding the conservative range of parameter values, but not the entire absolute parameter range, may be examined.

A parameter value restricting the conservative parameter range may be used as the first start parameter value of the binary search. Furthermore, a parameter value restricting the absolute parameter range may be used as the second start parameter value of the binary search.

Further variants for determining the permissible range of parameter values are conceivable in which a gapless search and/or a binary search may be wholly or partially omitted. A further embodiment thus provides that the at least one limitation includes at least one maximum gradient property for at least one physical gradient axis, wherein a gradient optimization value is determined for each of the at least one physical gradient axes based on the at least one maximum gradient property and the at least one sequential pattern, wherein the permissible range of parameter values is determined on the basis of the at least one gradient optimization value.

In particular, it is conceivable that at least one maximum gradient property of a logical gradient axis is determined, based on which the permissible range of parameter values is determined. This happens, for example, when minimum periods of various sequence segments are added. A binary search, as described above, is advantageously unnecessary in the process.

To determine the at least one gradient optimization value for each time of the sequential pattern, a ratio of the maximum gradient property, (e.g., a maximum gradient amplitude and/or a maximum slew rate), to a gradient property predefined by the sequential pattern, (e.g., a gradient amplitude and/or slew rate), may be used. In addition, a gradient property may also be understood to refer to a property dependent on the gradient amplitude and/or the slew rate such as a stimulation. Accordingly, a gradient profile may also be understood to refer to a stimulation sequence.

The at least one sequential pattern is customarily the result of the at least one default parameter value. The minimum of the aforementioned ratios of the gradient optimization value, e.g., the gradient optimization value, may be determined based on a minimum ratio of the maximum gradient property to a maximum of the at least one sequential pattern.

The predefined gradient property may be adjusted based on this minimum, in particular, a multiplication of the predefined gradient property by the gradient optimization value results in a new gradient property. This makes it possible to bring the gradient property to an optimized, in particular maximum, level without any gradient limitation.

The gradient optimization value may be greater than 1, e.g., the predefined gradient property is increased. However, it may also be smaller than 1, e.g., it is reduced. If the value 1 results as the gradient optimization value, as a rule, the gradient property remains unchanged.

As a rule, changed permissible ranges of parameter values result from the changed gradient properties. Thus, for example, as a result of an increase in gradient amplitudes, the expansion of a permissible range of parameter values for an echo time may be achieved as gradient pulses may be reduced without changing the torque of the gradient pulse, also enabling a reduction in the echo time. Thus, for example, the time required for an examination may be reduced.

In an advantageous embodiment of the method, in determining the permissible range of parameter values an optimization analysis of the sequence, in particular, of a development of the sequence, is performed. The optimization analysis may be performed with the aid of the at least one gradient optimization value.

The optimization analysis may be used to determine whether and/or whereby the at least one limitation is exceeded. The sequence may include at least one sequence object such as at least one gradient pulse, wherein the optimization analysis is used to establish which sequence object exceeds the at least one limitation. Feedback to the sequence may take place with this information.

Possible adjustments of at least one gradient property may be analyzed based on the optimization analysis. For example, the effect of a change, (in particular, of an increase and/or reduction), of a gradient amplitude and/or a slew rate may be tested on the sequence.

The optimization analysis may take place based on optimization rules. For example, the optimization rules may be used to determine that by a possible reaction of the sequence to a result of the optimization analysis coding of magnetic resonance signals are maintained, in particular with the torque of gradient pulses remaining constant. The optimization rules may be stored in the analysis unit.

Furthermore, it is conceivable that the optimization analysis only provides for the alteration of certain gradient pulses, in particular, those which restrict the range of parameter values to be determined.

A further embodiment provides that the at least one limitation includes at least one maximum gradient property, in particular, a maximum gradient amplitude and/or a maximum gradient rise time, for at least one physical gradient axis. The selected parameter is dependent on a rotation angle parameter. In particular, the selected parameter is a rotation angle parameter. Furthermore, in determining the at least one sequential pattern at least one sequential pattern of a gradient property including a plurality of times is determined. A Euclidean total of the gradient property on each at least one physical gradient axis is determined for each of the plurality of times and compared to the at least one maximum gradient property.

In this context, a rotation angle parameter may refer to an angle which describes a rotation of the logical gradient axes to the physical gradient axes.

A Euclidean total of a vector $v=(v_1,v_2,v_3)$ is customarily calculated as $(v_1^2+v_2^2+v_3^2)^{0.5}$. In this context, the gradient property may be understood as a vector, in particular the gradient amplitude with $G=(G_x,G_y,G_z)$ and/or the gradient rise time $S=(S_x,S_y,S_z)$, wherein $G_x$ and $S_x$ represent the gradient amplitude and the gradient rise time on the x axis, $G_y$ and $S_y$ the gradient amplitude and the gradient rise time on the y axis and $G_z$ and $S_z$ the gradient amplitude and the gradient rise time on the z axis. Accordingly, the Euclidean total of the gradient amplitude may be calculated by $(G_x^2+G_y^2+G_z^2)^{0.5}$ and/or the Euclidean total of the gradient rise time by $(S_x^2+S_y^2+S_z^2)^{0.5}$.

As parameter ranges of rotation angles are not convex as a rule, without an examination by way of the Euclidean total a gapless search might be necessary, as aforementioned. The gapless search would be relatively time-consuming on account of the customarily high number of rotation angles to be tested and the resulting sequential patterns. By determining the Euclidean total, if necessary based on only one sequential pattern, a gradient property may be examined for fulfillment of the maximum gradient property, e.g., sequential patterns need not be created and examined for a multiplicity of rotation angle parameter values.

Rotation angle parameters customarily have only an indirect influence on sequence timing, e.g., the timing within a sequence does not normally change as a result of changing a rotation angle parameter value. While, for example, in the case of a change in the echo time and/or the repetition time and/or the readout bandwidth time intervals and consequently also gradient profiles between individual events such as excitation or readout procedure, often change, these remain constant when the rotation angle parameter values are changed. A gradient profile may refer to a profile of a gradient amplitude and/or a slew rate.

When the maximum gradient property is exceeded by the Euclidean total of the gradient property, at least one permissible rotation angle parameter value may be determined with the aid of a gapless search. A rotation angle parameter may be examined with regard to the at least one limitation. The rotation angle parameter values to be tested may have a resolution, for example, angles from −180° to +180° with increments of 0.01° may be examined, which would mean a tally of 36000 values. As the parameters of the sequence are customarily rotation-dependent and the dependencies are customarily non-linear, all possible values are advantageously tested.

A further embodiment of the method provides that the examination is gradually performed for one of the at least one rotation angle values from time to time, wherein if the maximum gradient property, in particular, the maximum gradient amplitude and/or the maximum slew rate, is exceeded, the examination is interrupted by the gradient property assigned to the respective time.

For a rotation angle value that leads to the maximum gradient property being exceeded for a time, advantageously no further examination is therefore performed for other times. Rather, such a rotation angle value may be stored and marked as prohibited after completion of the examination. The efficiency of the examination may therefore be increased as a result.

An embodiment of the method provides that at least one independent range of parameter values of at least one independent parameter of the sequence is determined. At least one dependent parameter value of the at least one dependent parameter of the sequence is examined based on the at least one independent range of parameter values and the at least one limitation.

To determine the independent range of parameter values of the at least one independent parameter, for example, at least one parameter may be provided by the parameter provision unit. At least one parameter may be selected and determined as an independent parameter by the selection unit from the parameters provided.

The at least one independent parameter may refer to a parameter which may be freely selected within the associated independent range of parameter values. For example, the at least one independent parameter may relate to the aforementioned rotation angle. Based on a sequence which is already optimized with regard to the utilization of the gradient properties such as maximum gradient amplitude and/or a maximum slew rate, simultaneous rotation independence may be achieved by way of the embodiment of the method described here without making significant coatings when utilizing the gradient properties.

The at least one dependent parameter may be understood to be a parameter which is dependent on the at least one dependent parameter, e.g., an alteration of the at least one independent parameter value has an impact on the at least one dependent parameter value. For example, the gradient amplitude of a physical gradient axis may be dependent on a selected rotation angle value.

Through an examination of the at least one dependent parameter value of the at least one dependent parameter of the sequence based on the at least one independent range of parameter values and the at least one limitation, it is possible to determine whether a conflict may occur for an, in particular arbitrary, selection of a value within the independent range of parameter values with the at least one limitation and the at least one independent parameter value, for example, as a result of exceeding a maximum gradient amplitude and/or a maximum slew rate.

The examination may be performed by the simulation unit. In particular, the aforementioned methods may be used for this purpose. For example, all possible rotation angle values may be tested. This may take place by trying out every angle adjustment and/or by calculating the most unfavorable angle for each time or section of the sequence.

At least one dependent parameter value of the at least one independent parameter of the sequence may be adjusted when the at least one limitation for at least one critical value of the at least one independent range of parameter values is not met.

For example, if a maximum gradient amplitude and/or a maximum slew rate is exceeded on a physical gradient axis when selecting a particular critical value, for example, a particular rotation angle, of the at least one independent range of parameter values, the gradient pulses are adjusted accordingly.

The at least one critical value of at least one independent range of parameter values may include all possible values of the at least one independent range of parameter values, thus avoiding non-compliance with the at least one limitation under any circumstances.

However, it is also conceivable that the at least one critical value of at least one independent range of parameter values includes a range of all possible values of the at least one independent range of parameter values, so that the complete independence, for example, of rotation angles and other parameters is not achieved but the adjustable areas are based on empirical values and/or statistics. For example, for a sequence type in a database the actual rotation angle selected for a performed measurement, etc., is saved and analyzed in order to deduce the range of all possible values for the at least one critical value. For example, it may be discovered that for a particular sequence type for a head examination a restricted angle range of ±10° occurs in more than 95% of patients. Higher system management is thus provided for an overwhelming majority of examinations.

As already described, the at least one independent range of parameter values may include at least one angle of rotation range of at least one rotation angle parameter. However, it is also conceivable that the at least one independent range of parameter values includes at least one area of a field of view (FoV) and/or a resolution and/or a bandwidth. Besides the independence of the rotation angle, in addition or alternatively more independencies for other parameters may therefore be taken into consideration, (such as the FoV), that may often vary slightly from patient to patient.

Furthermore, a magnetic resonance device is proposed which is designed to execute a method for setting a magnetic resonance imaging sequence. The magnetic resonance device may include a limitation provision unit designed to provide at least one limitation and a sequence parameter provision unit which is designed to provide a plurality of parameters of a sequence. Moreover, the magnetic resonance device may include a selection unit, (e.g., an input unit), which is designed to enable the selection of one of the plurality of parameters, and a simulation unit which is designed to determine at least one sequential pattern based on the at least one selected parameter. Furthermore, the magnetic resonance device may include an analysis unit designed to determine a permissible range of parameter values of the selected parameter based on the at least one temporal sequential pattern and the at least one limitation, and a determination unit, in particular an input unit, which is designed to enable the determination of a parameter value within the permissible range of parameter values. The magnetic resonance device may be designed to perform data acquisition based on the determined parameter values.

The advantages of the magnetic resonance device corresponds to the advantages of the method for setting a magnetic resonance imaging sequence, which are performed in detail in advance. Likewise, features, advantages, or alternative embodiments mentioned here may also be transferred to the other claimed objects and vice versa.

In other words, the objective claims, that is to say, with the features which are described or claimed in connection with a method, may be developed. The corresponding functional features of the method are embodied by corresponding objective modules, in particular, by hardware modules.

In addition, a computer program product is provided that includes a program and which may be loaded directly into a storage unit of a programmable arithmetic unit of a magnetic resonance device, using program resources, to execute a method for setting a magnetic resonance imaging sequence when the program is executed in the arithmetic unit of the magnetic resonance device.

The computer program product may include software with a source code which has yet to be compiled and linked or which only needs to be interpreted, or an executable software code which has only to be loaded into the storage unit of the arithmetic unit of the magnetic resonance device for execution. The method may be executed quickly, identically repeatedly and robustly by the computer program product. The computer program product is configured such that it may execute the method acts by way of the arithmetic unit. The arithmetic unit meets the respective requirements, (such as a corresponding main memory, a corresponding graphics card, or a corresponding logic unit), to enable the respective method acts to be executed efficiently. The computer program product is, for example, saved on a computer-readable medium or stored on a network or server from where it may be loaded into a processor of the system control unit. Examples of computer-readable media are a DVD, a magnetic tape, or a USB stick on which electronically readable control information, in particular, software is stored. The disclosure may therefore also be based on the computer-readable medium.

BRIEF DESCRIPTION OF THE DRAWINGS

Further advantages, features and details of the disclosure will emerge from the exemplary embodiments described below and with reference the drawings. Parts corresponding to each other have the same reference characters in all the figures, in which:

FIG. 1 depicts a diagram of a magnetic resonance device, according to one example.

FIG. 2 depicts an exemplary block diagram of a method for setting a sequence.

FIG. 3 depicts a k-space with an external area, according to one example.

FIG. 4 depicts three exemplary sequential patterns.

FIG. 5 depicts an example of a schematic diagram of a gapless or complete search.

FIG. 6 depicts an example of a schematic diagram of a binary search.

FIG. 9 depicts further exemplary sequential patterns.

FIG. 10 depicts an exemplary block diagram of a development of the method for setting a sequence.

DETAILED DESCRIPTION

Figure 7:
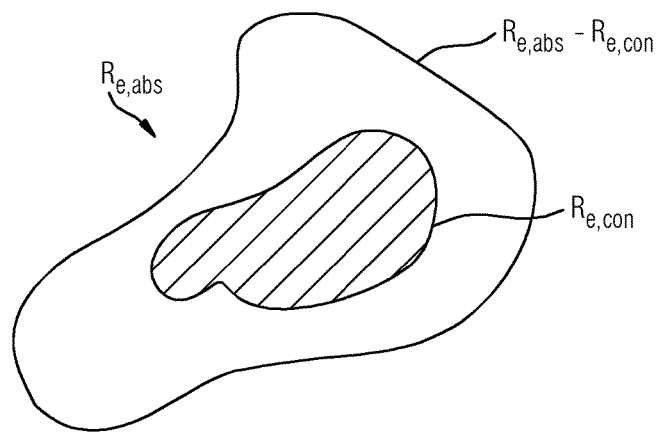
FIG. 7 depicts an example of a schematic diagram of an absolute and a conservative range of parameter values.

FIG. 1 depicts a diagrammatic view of a magnetic resonance device 10. The magnetic resonance device 10 includes a magnet unit 11 which has a superconductive main magnet 12 for the generation of a strong and, in particular, temporally constant main magnetic field 13. In addition, the magnetic resonance device 10 includes a patient receiving area 14 for receiving a patient 15. The patient receiving area 14 in the present exemplary embodiment is cylindrical in design and cylindrically enclosed by the magnet unit 11 in a peripheral direction. In principle, however, an embodiment of the patient receiving area 14 differing from this is conceivable at any time. The patient 15 may be pushed into the patient receiving area 14 by a patient positioning device 16 of the magnetic resonance device 10. The patient positioning device 16 has a mobile patient table 17 inside the patient receiving area 14 for this purpose.

Furthermore, the magnet unit 11 includes a gradient coil unit 18 for the generation of magnetic field gradients which are used for spatial coding during imaging and often has three physical gradient axes. The gradient coil unit 18 is controlled by a gradient control unit 19 of the magnetic resonance device 10. Furthermore, the magnet unit 11 includes a RF antenna unit 20 which in the present exemplary embodiment is embodied as a body coil permanently integrated into the magnetic resonance device 10. The RF antenna unit 20 is designed to excite atomic nuclei which are established in the main magnetic field generated by the main magnet 12. The RF antenna unit 20 is controlled by a radio-frequency antenna control unit 21 of the magnetic resonance device 10 and emits radio-frequency magnetic resonance sequences into an examination area that includes a patient receiving area 14 of the magnetic resonance device 10. Furthermore, the RF antenna unit 20 is designed to receive magnetic resonance signals.

The magnetic resonance device 10 has a system control unit 22 to control the main magnet 12, the gradient control unit 19, and the radio-frequency antenna control unit 21. The system control unit 22 centrally controls the magnetic resonance device 10, for example, the performance of a predetermined imaging sequence such as a gradient echo sequence and/or a spin echo sequence. In addition, the system control unit 22 includes a reconstruction unit not shown in more detail for the reconstruction of medical image data recorded during a magnetic resonance examination. Furthermore, the magnetic resonance device 10 includes a user interface 23 which is linked to the system control unit 22. Control information such as imaging parameters, and reconstructed magnetic resonance images may be displayed on a display unit 24, for example, on at least one monitor, of the user interface 23 for medical operating personnel. Furthermore, the user interface 23 has an input unit 25 by which the information and/or parameters may be entered by the medical operating personnel during a measurement procedure.

In order to execute a method for setting a magnetic resonance imaging sequence, the magnetic resonance device 10, (e.g., the system control unit 22), includes a limitation provision unit 26 designed to provide at least one limitation, and a sequence parameter provision unit 27 designed to provide a plurality of parameters of a sequence. One of the plurality of parameters may be selected by the input unit 25, which in this exemplary embodiment includes a selection unit not shown here. However, automatic selection is also conceivable. In addition, the magnetic resonance device 10 includes a simulation unit 28 designed to determine at least one sequential pattern based on the at least one selected parameter, and an analysis unit 29 designed to determine a permissible range of parameter values of the selected parameters based on the at least one temporal sequential pattern and the at least one limitation. Furthermore, the input unit 25 is designed to enable the determination of a parameter value within the permissible range of parameter values. The input unit includes a determination unit not shown here in this exemplary embodiment. Data acquisition may be performed with the magnetic resonance device 10 based on the determined parameter value.

In particular, the system control unit 22 includes a programmable arithmetic unit 30 having a storage unit, into which a program product may be loaded. The computer program product includes program resources for executing a method for setting a magnetic resonance imaging sequence when the program is executed in the arithmetic unit 30 of the magnetic resonance device 10.

The magnetic resonance device 10 shown in the present exemplary embodiment may include additional components which customarily have magnetic resonance devices. In addition, a general functionality of a magnetic resonance device 10 is known to a person skilled in the art, waiving the need for a detailed description of the general components.

FIG. 2 depicts a block diagram of an embodiment of the method. In act 110, a limitation $L_1$ is provided by a limitation provision unit 26, wherein additional limitations $L_2$, $L_3$, etc. are also conceivable.

In act 120, a plurality of, here two, parameters $P_1$, $P_2$ of a sequence are provided by a parameter provision unit 27, wherein additional parameters $P_3$, $P_4$, etc. are also conceivable. A default parameter value $PW_1$ is assigned to the parameter $P_1$ and a default parameter value $PW_2$ to the parameter $P_2$.

In act 130, a parameter is selected from the plurality of parameters $P_1$ and $P_2$, for example, $P_2$. This selection is made, for example, by an operator who uses the input unit 25 for this purpose. For the selection, all or some of the parameters $P_1$, $P_2$ may be offered to the user, for example, by a display by way of the display unit 24.

Based on the default parameter values $PW_1$, $PW_2$, in act 140 at least one signal path is determined by a simulation unit 28. In this example, a signal path $SE_1$ is determined for a test parameter value $PW_{e,1}$. Additional signal paths $SE_2$, $SE_3$, etc. for additional test parameter values $PW_{e,1}$, $PW_{e,3}$ may also be determined. The test parameter values $PW_{e,1}$, $PW_{e,2}$, $PW_{e,3}$ may be values assigned to the selected parameter $P_e$.

The determination of the at least one signal path $SE_1$ may refer to a temporal roll-out of at least one section of the sequence. Advantageously, the at least one section is representative of the entire sequence. During roll-out, for example, the at least one section of the sequence is divided into a plurality of times for each of which a historical value is calculated.

In particular, gradient profiles may be rolled out. It is conceivable that the gradient profiles are shown such that they are actually performed by the hardware of the magnetic resonance device in the end, for example, with eddy current compensation or the like being taken into account.

In act 150 a permissible range of parameter values $R_e$ of the selected parameter $P_e$ is determined by an analysis unit 29 based on the at least one sequential pattern $SE_1$ and the at least one limitation $L_1$.

The determination of the permissible range of parameter values $R_e$ may therefore include the examination of the at least one sequential pattern $SE_1$. Each of the times of the sequential pattern may be examined with regard to the at least one limitation $L_1$ in order to determine a permissible parameter value. In the examination, for example, gradient properties such as gradient amplitude and/or slew rate, on the individual gradient axes, expected heating, for example, based on averaged gradient amplitudes, and/or a generated stimulation may be assessed.

Furthermore, it is conceivable that the examined signal path is advantageously divided into various subsections which are considered individually by the simulation unit with an independent analysis being performed for each subsection.

The roll-out and the examination of the at least one sequential pattern $SE_1$ is advantageously performed while the operator parameterizes a measurement. In an embodiment the parameter range $R_e$ available to the operator, which may also be termed parameter space, adapts itself to the examination based on the results of the examination during selection of the parameters in a user interface 23.

In act 160, the operator may determine a new parameter value $PW'_e$ of the selected parameter $P_e$. The new parameter value $PW'_e$ is advantageously within the permissible range of the parameter value $R_e$.

A two-dimensional gradient echo sequence with T1 contrast is mentioned as an exemplary embodiment. For a main magnetic field strength 13 of three (3) Tesla, for example, an echo time of 2.3 ms is required, as a result of which the possible resolution and/or bandwidth are limited. If from the outset, for example, only 50% of an actual possible gradient amplitude were permitted on the physical gradient axes in order to exclude, for instance, any unfavorable parameter constellations from the outset, enabling the sequence to also be performed with an unfavorable orientation of a measurement layer, a bandwidth of, for example, 380 Hz per pixel would result.

An unfavorable orientation may, for example, result when all the gradient objects of logical gradient axes between the excitation and acquisition of magnetic resonance signals are incident on a physical gradient axis. This may not be the case, however, as in certain cases the rotation of a MRI image differs only slightly from the physical gradient axes. Therefore, the individually desired rotation is taken into account, which in this example is represented by one or more of the existing default parameter values which are provided in act 120. In act 130, the bandwidth is selected on which in act 140 sequential patterns, in particular gradient profiles of at least one representative section, are determined. A representative section may advantageously include external k-space lines, which are shown in an exemplary manner in FIG. 3. A recorded k-space is here limited on a phase coding axis $k_p$ by $-k_{p,max}$ and $k_{p,max}$ and on a frequency coding axis $k_f$ by $-k_{f,max}$ and $k_{f,max}$. The external k-space lines are located in an external area 300 and in the recorded k-space, wherein the external area 300 is limited in the direction of a center C of the k-space on a phase coding axis $k_p$ by $-k_{p,i}$ and $k_{p,i}$ and on a frequency coding axis $k_f$ by $-k_{f,i}$ and $k_{f,i}$. The external area 300 may be spaced apart from a center C of the k-space by at least 70%, (e.g., $k_{p,i}/k_{p,max} \geq 70\%$), at least 80%, (e.g., $k_{p,i}/k_{p,max} \geq 80\%$), or at least 90%, (e.g., $k_{p,i}/k_{p,max} \geq 90\%$), of the recorded k-space. Advantageously, the k-space lines in this external area use the highest gradient amplitudes. The determination of the at least one sequential pattern in act 140 may be started as soon as an operator clicks in a field with the heading "bandwidth".

The at least one sequential pattern is examined with regard to the at least one limitation. The examination may include a plurality of partial examinations, wherein for each partial examination one of the at least one limitations is examined respectively. The partial examinations may be performed in descending order of priority with partial examinations with a lower priority only performed when those with higher priority are positive. A possible prioritization would be: 1. Gradient amplitude, 2. Slew rate, 3. Stimulation, 4. Heating.

The examination may result in a minimum bandwidth of 240 Hz per pixel when the bandwidth of the gradient coil unit 18 is fully utilized. However, in doing so, for example, a stimulation limit would be exceeded so that the permissible range of parameter values $R_e$ determined in act 150 is limited by a minimum bandwidth of 265 Hz, for example. In act 160, for example, the bandwidth may be specified as the minimum bandwidth of 265 Hz. A reduction from originally 380 to 265 Hz per pixel would correspond to an increase in the signal-to-noise ratio of the magnetic resonance signal of 20%.

FIG. 4 depicts three determined sequential patterns $SE_1$, $SE_2$, $SE_3$ in an exemplary manner. The sequential patterns in this example are paths of a gradient amplitude G over time t. Each of the sequential patterns $SE_1$, $SE_2$, $SE_3$ is based on other test parameter values of a selected parameter $P_e$, for example, a rotation angle parameter, e.g., a first sequential pattern $SE_1$ is determined on the basis of a first test parameter value $PW_{e,1}$, a second sequential pattern $SE_2$ is determined based on a second test parameter value $PW_{e,2}$ and a third sequential pattern $SE_3$ is determined on the basis of a third test parameter value $PW_{e,3}$.

To determine the permissible range of parameter values, the respective sequential patterns $SE_1$, $SE_2$, $SE_3$ are examined in terms of whether they comply with the at least one limitation $L_1$, which in this example is provided by the observance of a maximum gradient amplitude $G_{max}$, e.g., the amount of the gradient amplitude may be less than or equal to $G_{max}$ here.

The sequential patterns display a plurality of times $Z_1$, $Z_2$, $Z_3$, $Z_4$, etc. This limitation $L_1$ may be checked for each of these various times. For this example, this would mean that the gradient profile $SE_1$ infringes the limitation $L_1$ in the times $Z_{10}$, $Z_{11}$ and $Z_{12}$, e.g., the amount of the gradient amplitude is greater than the maximum gradient amplitude $G_{max}$. Here this means that the test parameter values $PW_{e,1}$, based on which the first sequential pattern $SE_1$ would be rolled out, is not a permissible parameter value of a selected parameter $P_e$. The permissible parameter range $R_e$ in this example therefore contains only $PW_{e,2}$ and $PW_{e,3}$. In act 160, the operator may therefore select the parameter $PW_{e,2}$ as a new parameter value $PW'_e$ from this parameter range $R_e$.

The determination of the permissible range of parameter values may be performed with the aid of a gapless search and/or a binary search.

In a gapless search, as a rule in act 140, a signal path $SE_{1,x}$, x=1, ... is determined for each test parameter value $PW_{e,x}$, x=1, ..., wherein in act 150, each ascertained signal path is checked with regard to the at least one limitation. In FIG. 5, this is demonstrated in an exemplary manner: here ten test parameter values $PW_{e,1}$, ..., $PW_{e,10}$ are to be examined. In act 140 a signal path $SE_{e,1}$, ..., $SE_{e,10}$ is determined for each of these ten test parameter values. The examination in act 150 shows, for example, that the signal paths $SE_{e,1}$, $SE_{e,4}$, $SE_{e,5}$, $SE_{e,9}$, $SE_{e,10}$ meet at least one limitation and accordingly the signal paths $SE_{e,2}$, $SE_{e,3}$, $SE_{e,6}$, $SE_{e,7}$, $SE_{e,8}$ do not. The permissible parameter range $R_e$ therefore includes the test parameter values $PW_{e,1}$, $PW_{e,4}$, $PW_{e,5}$, $PW_{e,9}$, $PW_{e,10}$. This is illustrated with the aid of check marks in FIG. 5, whereas the parameter values which are not permissible have a cross.

In particular, if the test parameter values $PW_{e,1}$, ..., $PW_{e,10}$ are sorted, for example, $PW_{e,1} < PW_{e,2}$, $PW_{e,2} < PW_{e,3}$, ..., $PW_{e,9} < PW_{e,10}$ applies, the permissible parameter range $P_e$ includes a non-convex amount as the applicable $SE_{e,1}$, $SE_{e,4}$, $SE_{e,5}$, $SE_{e,9}$, $SE_{e,10}$ have gaps. For test parameter values for which a non-convex parameter range $P_e$ may be produced, consequently a gapless search is particularly suitable as all the permissible parameter values may thus be reliably found.

In contrast, a binary search is particularly suitable for test parameter values for which a convex parameter range $P_e$ is customarily produced. This may apply to the example depicted in FIG. 6, in which ten test parameter values $PW_{e,1}, \ldots, PW_{e,10}$ are given again. The test parameter values have a first start parameter value and a second start parameter value which customarily represent the external and/or the extremes of the test parameter values. Thus, for example, the test parameter value $PW_{e,1}$ may be regarded as the first and the test parameter value $PW_{e,10}$ as the second start parameter value. The start parameter values may possibly be derived from the at least one limitation.

Furthermore, it is advantageously known here that the at least one limitation is met for the first start parameter value. Therefore, the determination of a signal path may be waived for this start parameter value.

With reference to the aforementioned example which describes the determination of a bandwidth, a bandwidth value of 380 Hz per pixel may be used as the first start parameter value.

With the binary search, an examination is advantageously performed first for a central test parameter value between the first and the second start parameter value. With an even number of test parameter values for examination, as a rule there is no test parameter value which divides the amount of test parameter values into two partial amounts of exactly the same size. Therefore, a central parameter value may also divide an amount of test parameter values for examination into two partial amounts, the numbers of test parameter values of which differ by one.

In this case, for example, first the test parameter value $PW_{e,6}$ is therefore examined, e.g., a corresponding signal path $SE_{e,6}$ which is examined in terms of the at least one limitation is determined. In an exemplary manner, it may be assumed that this examination results in the at least one limitation not being met. Then the new amount of test parameter values now to be examined, which is now limited by $PW_{e,1}$ and $PW_{e,6}$, is divided by a new central test parameter values $PW_{e,3}$. According to this principle, in the binary search the amount of test parameter values to be examined is gradually halved so that in this example only the determination of three signal paths $SE_{e,3}$, $SE_{e,4}$ and $SE_{e,6}$ is necessary in order to determine the permissible range of parameter values $P_e$, which include the parameter values $PW_{e,1}$, $PW_{e,2}$ and $PW_{e,3}$. A binary search is therefore a particularly efficient alternative for test parameter values for which a convex parameter range $P_e$ is customarily produced.

Both in the gapless search according to FIG. 5 and in the binary search according to FIG. 6, it is conceivable that all the test parameter values $PW_{e,1}, \ldots, PW_{e,10}$ are applicable. In this case, the area to be examined may be expanded, e.g., a further search may be performed including test parameter values which, for example, are greater than $PW_{e,10}$.

The at least one limitation may include at least one absolute limitation and at least one conservative limitation. The at least absolute limitation may establish an absolute range of parameter values $R_{e,abs}$ and the at least one conservative limitation a conservative range of parameter values $R_{e,con}$, as illustrated in FIG. 7. At least one permissible range of partial parameter values may be determined in at least one differential area $R_{e,abs}-R_{e,con}$ of the absolute range of parameter values $R_{e,abs}$ and conservative range of parameter values $R_{e,con}$, wherein the permissible range of parameter values includes the conservative range of parameter values and the permissible range of partial parameter values. The range of parameter values for examination is reduced as a result, thus enabling the method to be accelerated.

Figure 8:
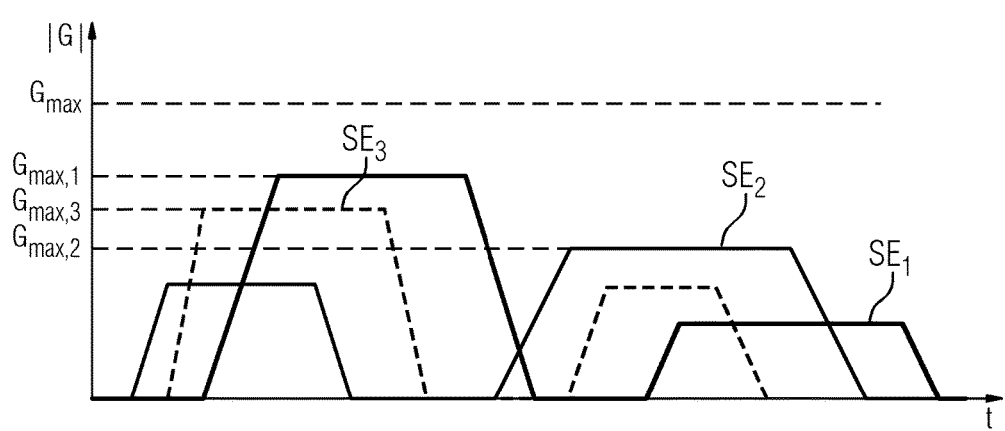
FIG. 8 depicts further exemplary sequential patterns.

A further embodiment is illustrated in more detail in FIG. 8. Here, the at least one limitation includes a maximum gradient property for a physical gradient axis, here by way of example a maximum gradient amplitude $G_{max}$. Furthermore, three gradient profiles $SE_1$, $SE_2$ and $SE_3$ are shown in an exemplary manner as sequential patterns, wherein the gradient profiles represent a chronological sequence of an amount of a gradient amplitude $|G|$ for one physical gradient axis in each case, for example, $SE_1$ for an x axis, $SE_2$ for a y axis, and $SE_3$ for a z axis. Each gradient profile has at least one maximum $G_{max,1}$, $G_{max,2}$, $G_{max,3}$ which may be described using $G_{max,1}=\max(SE_1)$ for the gradient profile $SE_1$, for example.

A gradient optimization value K may be determined from the sequence, by determining a ratio V for each signal path $SE_1$, $SE_2$ and $SE_3$ from the maximum gradient amplitude $G_{max}$ to a maximum of the signal path $G_{max,1}$, $G_{max,2}$, $G_{max,3}$, resulting in $V_1=G_{max}/G_{max,1}=4/3$, $V_2=G_{max}/G_{max,2}=2$ and $V_3=G_{max}/G_{max,3}=8/5$ for this example. The gradient optimization value K may be the minimum of the calculated ratios, e.g., in this case $K=\min(V_1;V_2;V_3)=4/3$.

Gradient profiles may therefore be increased by a factor K without exceeding the maximum gradient amplitude. As a result of such an increase, gradient pulses may often be reduced while retaining their gradient torque, resulting in an acceleration of magnetic resonance imaging.

Tilting of the coordinate systems by physical and logical gradient axes may be described with the aid of rotation matrices. For example, for a rotation by an angle θ around the x axis, a corresponding rotation matrix is:

$$R_x(\theta) = \begin{bmatrix} 1 & 0 & 0 \\ 0 & \cos(\theta) & -\sin(\theta) \\ 0 & \sin(\theta) & \cos(\theta) \end{bmatrix}$$

The same applies to the y and the z axis. Based on such a rotation matrix it follows with a matrix equation $G_{phys}=RG_{log}$ which part has which logical gradient on which physical gradient axis. For example, the gradient amplitude required at one time on the x axis may include contributions from all the logical gradient axes.

If the coordinate systems of the physical gradient axes and the logical gradient axes tally, the examination may similarly also be performed based on the gradient profiles of the logical gradient axes. Otherwise, the proportion of logical gradient axes on the physical gradient axes may be considered based on the inverted rotation matrices of the aforementioned rotation matrices. For example, it may be established that a phase coding gradient $G_p$ might be greater on the x axis by a factor of 2, on the y axis by 1.5 and on z by 3. Analogous observations may be made for a frequency coding gradient $G_f$ and a layer selection gradient $G_s$. A minimum of these values may be used in order to achieve a maximum gradient amplitude for each logical gradient axis.

An analogous approach may also be taken with other gradient properties, (such as a slew rate and/or a stimulation), wherein advantageously a time derivative of the gradient amplitude and/or for an examination of a time $Z_i$, also a previous time $Z_{i-1}$ and/or a subsequent time $Z_{i+1}$, is taken into consideration.

Parameter meter ranges of parameters which are dependent on the gradient properties, to which parameter meter ranges of gradient properties themselves may naturally belong, may be efficiently determined in this way as only a few, as in this example three, sequential patterns need to be examined.

A further aspect is illustrated in FIG. 9, which is particularly advantageous if the parameter $P_e$ selected in act 130 is dependent on a rotation angle parameter $P_r$, e.g., $P_e(P_r)$. In particular, this is the case if a rotation angle parameter itself was selected, e.g., $P_e=P_r$, and the at least one limitation includes at least one maximum gradient property for at least one physical gradient axis. Customarily, the gradient coil unit 18 of the magnetic resonance device 10 has three physical gradient axes, for example, an x axis, a y axis, and a z axis, which may also be assumed for this example. Furthermore, it is assumed here that the maximum gradient property for all three physical gradient axes is the same, for example, a commensurate gradient amplitude $G_{max}=G_{max,x}=G_{max,y}=G_{max,z}$. In FIG. 9, gradient profiles determined in act 140 are shown in an exemplary manner for a gradient pulse over time t. This gradient profile includes a plurality of times $Z_1, Z_2, \ldots$. A Euclidean total of the gradient property is advantageously determined for at least one of the plurality of times $Z_1, Z_2, \ldots$. This act may be performed in an exemplary manner for the time $Z_{10}$. At this time, a gradient amplitude $G_x$ on the x axis has a value $G_x(Z_{10})$, a gradient amplitude $G_y$ on the y axis a value $G_y(Z_{10})$ and a gradient amplitude $G_z$ on the z axis a value $G_z(Z_{10})$. The Euclidean total $G_{es}$ at the time $Z_{10}$ is determined here with $G_{es}=(G_x(Z_{10})^2+G_y(Z_{10})^2+G_z(Z_{10})^2)^{0.5}$. $G_{es}$ is then advantageously compared to the at least one maximum gradient property, here $G_{max}$. If $G_{es} \leq G_{max}$ applies to each time of the gradient profiles, the rotation angle may be altered at will without infringing the maximum gradient property $G_{max}$.

In this way, the times of the gradient profiles may be examined consecutively. As soon as the comparison of the Euclidean total of the gradient property with the at least one maximum gradient property results in the at least one maximum gradient property being infringed, in particular exceeded, at least one permissible rotation angle may be determined with the aid of a gapless search, as already explained previously.

With the method shown, in particular, it is possible to prepare a sequence taking full advantage of the gradient coils. For example, when adjusting the sequence a first rotation of the acquisition is assumed, for example, purely sagittally. If this sequence is now to be stored and then used for a patient, the rotation and consequently the sequence is changed at least slightly. This dependence on rotation is possibly not acceptable for all applications as complete reproducibility may not be guaranteed.

FIG. 10 depicts a development of the method which is based on the optimization of the sequence in act 100. Some of the acts 110, 120, 130, 140, 150, 160 may also be performed several times until the optimization is complete.

This is followed by further adjustment of the magnetic resonance imaging sequence. In act 210, at least one independent range of parameter values $PW_i$ of at least one independent parameter $P_i$ of the sequence is established. Based on at least one limitation $L_1, \ldots$, provided in act 110, and of the at least one independent range of parameter values, at least one dependent parameter value $P_d$ is examined in act 220. Pd may also be one of the parameters $P_1, P_2, \ldots$.

At least one dependent parameter value $PW_d$ of the at least one independent parameter $P_d$ of the sequence is adjusted in act 240 if a comparison in act 230 results in the at least one limitation $L_1, \ldots$ not being met for at least one critical value of the at least one independent range of parameter values $PW_i$. Otherwise, $PW_d$ is not changed, which is indicated by the act, wherein the at least one critical value of at least one independent range of parameter values includes all the possible values of the at least one independent range of parameter values.

The at least one critical value of at least one independent range of parameter values $PW_i$ may include all or a selection of all possible values of the at least one independent range of parameter values $PW_i$. The at least one independent range of parameter values $PW_i$ includes, for example, at least one angle of rotation range of at least one rotation angle parameter and/or at least one area of a field of view (FoV) and/or a resolution and/or a bandwidth.

With the acts 200, in particular, the best possible use may be made of the gradient coil unit 18 individually adjusted to the sequence, wherein measurements are nevertheless permitted in a defined independent range of parameter values $PW_i$ without further changes to the sequence. This enables the operator to obtain a reproducible measurement with regard to the measurement parameter with optimized use of the magnetic resonance device 10.

The acts 200 by which a parameter-independent sequence may be determined may be used in a sequence optimized in the acts 100. However, it is also conceivable that the acts 200 are applied to an arbitrary sequence, in other words, to a sequence to which the acts 110, 120, 130, 140, 150 and/or 160 were not applied.

Finally, it is pointed out again that the previous method described in detail and the magnetic resonance device shown are only exemplary embodiments which may be modified in all kinds of ways by a person skilled in the art without departing from the scope of the disclosure. Furthermore, the use of the indefinite article "a" or "an" does not rule out the features concerned also being present repeatedly. Likewise, the term "unit" and "module" do not rule out the components concerned including a plurality of interacting partial components which may possibly also be spatially dispersed.

It is to be understood that the elements and features recited in the appended claims may be combined in different ways to produce new claims that likewise fall within the scope of the present disclosure. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present disclosure has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A method for setting a sequence of magnet resonance imaging, the method comprising:
   providing, by a limitation unit, at least one limitation, wherein the at least one limitation comprises at least one device limitation;
   providing, by a parameter provision unit, a plurality of parameters of the sequence, wherein at least one parameter of the plurality of parameters is assigned to a default parameter value;

selecting, by a selection unit, a parameter of the plurality of parameters;

determining, by a simulation unit, at least one sequential pattern based on at least one default parameter value of default parameter values, determining, by an analysis unit, a permissible range of parameter values of the selected parameter based on the at least one sequential pattern and the at least one limitation; and establishing, by an establishment unit, a new parameter value of the selected parameter within the permissible range of the parameter values.

2. The method of claim 1, wherein, in the determining of the at least one sequential pattern, at least one correction gradient, at least one compensation gradient, or both the at least one correction gradient and the at least one compensation gradient are taken into account.

3. The method of claim 1, wherein the at least one sequential pattern comprises a plurality of times, and
wherein, in the determining of the permissible range of parameter values, each time of the plurality of times is investigated with regards to the at least one limitation.

4. The method of claim 1, wherein, in the determining of the permissible range of parameter values, various test parameter values are determined for the parameter value of the selected parameter.

5. The method of claim 1, wherein the at least one limitation comprises a plurality of limitations, and
wherein the plurality of limitations is investigated in a prescribed order.

6. The method of claim 1, wherein the at least one sequential pattern describes a section of the sequence.

7. The method of claim 1, wherein the permissible range of parameter values is determined with aid of a gapless search, a binary search, or both the gapless search and the binary search.

8. The method of claim 7, wherein a first start parameter value and a second start parameter value are derived from the at least one limitation for the binary search.

9. The method of claim 1, wherein the at least one limitation comprises at least one absolute limitation and at least one conservative limitation,
wherein the at least one absolute limitation establishes an absolute range of parameter values and the at least one conservative limitation establishes a conservative range of parameter values,
wherein at least one permissible range of partial parameter values is determined in at least one differential area of the absolute range of parameter values and the conservative range of parameter values, and
wherein the permissible range of parameter values comprises the conservative range of parameter values and the permissible range of partial parameter values.

10. The method of claim 1, wherein the at least one limitation comprises at least one maximum gradient property for at least one physical gradient axis,
wherein a gradient optimization value is determined for each of the at least one physical gradient axes based on the at least one maximum gradient property and the at least one sequential pattern, and
wherein the permissible range of parameter values is determined based on the at least one gradient optimization value.

11. The method of claim 10, wherein the gradient optimization value is determined based on a minimum of a ratio of the maximum gradient property to a maximum of the at least one sequential pattern.

12. The method of claim 10, wherein at least one maximum gradient property of a logical gradient axis is determined, on a basis of which the permissible range of parameter values is determined.

13. The method of claim 1, wherein an optimization analysis of the sequence is performed for the determining of the permissible range of parameter values.

14. The method of claim 13, wherein the optimization analysis takes place based on optimization rules.

15. The method of claim 13, wherein the sequence reacts to a result of the optimization analysis.

16. The method of claim 1, wherein the at least one limitation comprises at least one maximum gradient property for at least one physical gradient axis,
wherein the selected parameter is dependent on a rotation angle parameter,
wherein at least one sequential pattern of a gradient property comprising a plurality of times is determined for the determination of the at least one sequential pattern, and
wherein, for at least one time of the plurality of times, a Euclidean total of the gradient property is determined and compared with the at least one maximum gradient property.

17. The method of claim 16, wherein at least one permissible rotation angle is determined with aid of a gapless search when the Euclidean total of the gradient property exceeds the maximum gradient property.

18. The method of claim 16, wherein an examination for one rotation angle value of the at least one rotation angle values is gradually performed from time to time, and
wherein the examination is interrupted by the gradient property assigned to the respective time when the maximum gradient property is exceeded.

19. The method of claim 1, wherein at least one independent range of parameter values of at least one independent parameter of the sequence is determined, and
wherein at least one dependent parameter value of at least one dependent parameter of the sequence is examined based on the at least one independent range of parameter values and the at least one limitation.

20. The method of claim 19, wherein at least one dependent parameter value of the at least one independent parameter of the sequence is adjusted when the at least one limitation for at least one critical value of the at least one independent range of parameter values is not met.

21. The method of claim 20, wherein the at least one critical value of the at least one independent range of parameter values comprises a plurality of critical values, wherein the plurality of critical values comprise all possible values of the at least one independent range of parameter values.

22. The method of claim 20, wherein the at least one critical value of the at least one independent range of parameter values comprises a plurality of critical values, wherein the plurality of critical values comprise a selection of all the possible values of the at least one independent range of parameter values.

23. The method of claim 19, wherein the at least one independent range of parameter values comprises at least one angle of rotation range of at least one rotation angle parameter.

24. The method of claim 19, wherein the at least one independent range of parameter values comprises one or more of the following: at least one area of a Field of View (FoV), one resolution, or one bandwidth.

25. The method for setting a sequence of a magnetic resonance imaging, the method comprising:
- providing at least one limitation by a limitation provision unit, wherein the at least one limitation comprises at least one device limitation;
- determining at least one independent range of parameter values of at least one independent parameter of the sequence; and
- examining the at least one dependent parameter value of the at least one dependent parameter of the sequence based on the at least one independent range of parameter values and the at least one limitation.

26. A magnetic resonance device comprising:
- a limitation provision unit configured to provide at least one limitation, wherein the at least one limitation comprises at least one device limitation;
- a sequence parameter provision unit configured to provide a plurality of parameters of a measurement sequence;
- a selection unit configured to enable a selection of a parameter of the plurality of parameters;
- a simulation unit configured to establish at least one sequential pattern based on the selected parameter;
- an analysis unit configured to establish a permissible range of parameter values of the selected parameter based on the at least one sequential pattern and the at least one limitation; and
- a determination unit configured to enable a determination of a parameter value within the permissible range of the parameter values,
- wherein the magnetic resonance device is configured to acquire measurement data based on the determined parameter value.

27. A computer program product comprising a program configured to be loaded directly into a memory of a programmable arithmetic unit of a magnetic resonance device, wherein the computer program product, when executed in the arithmetic unit of the magnetic resonance device, is configured to perform at least the following:
- provide at least one limitation, wherein the at least one limitation comprises at least one device limitation;
- provide a plurality of parameters of the sequence, wherein at least one parameter of the plurality of parameters is assigned to a default parameter value;
- select a parameter of the plurality of parameters;
- determine at least one sequential pattern based on at least one default parameter value of default parameter values,
- determine a permissible range of parameter values of the selected parameter based on the at least one sequential pattern and the at least one limitation; and
- establish a new parameter value of the selected parameter within the permissible range of the parameter values.

* * * * *